(12) United States Patent
Chao

(10) Patent No.: US 11,774,491 B1
(45) Date of Patent: Oct. 3, 2023

(54) SYSTEM AND METHOD FOR TESTING A SEMICONDUCTOR CHIP

(71) Applicant: NANYA TECHNOLOGY CORPORATION, New Taipei (TW)

(72) Inventor: Yi-Kai Chao, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/835,308

(22) Filed: Jun. 8, 2022

(51) Int. Cl.
*G01R 31/28* (2006.01)

(52) U.S. Cl.
CPC ..... *G01R 31/2865* (2013.01); *G01R 31/2863* (2013.01)

(58) Field of Classification Search
CPC .............. G01R 1/0483; G01R 31/2886; G01R 31/2863; G01R 31/2893; G01R 1/0433; G01R 1/0408; G01R 31/26; G01R 1/07307; G01R 31/2867; G01R 31/2851; G01R 1/07378; G01R 1/04; G01R 31/2808; G01R 1/0425; G01R 1/045; G01R 31/2853; G01R 31/2865; G01R 31/2818; G01R 31/66; G01R 31/316; G01R 31/31908; G01R 31/3187; G01R 31/2637; H01R 2201/20; H01R 33/76; H01R 13/2414; H01R 13/6315; H01R 13/639; H01R 13/40; H01R 13/62905; H01R 13/05
See application file for complete search history.

(56) References Cited

U.S. PATENT DOCUMENTS

| | | | | |
|---|---|---|---|---|
| 5,534,785 A * | 7/1996 | Yoshizaki | ............ | G01R 1/0483 324/750.05 |
| 6,040,702 A * | 3/2000 | Hembree | ............ | G01R 1/0483 324/750.19 |
| 6,285,202 B1 * | 9/2001 | Hembree | ............ | G01R 1/0466 324/754.13 |
| 6,501,291 B1 * | 12/2002 | Shen | .................... | G01R 1/0433 324/762.01 |
| 8,939,784 B2 * | 1/2015 | Lee | ........................ | H01R 12/00 439/314 |

* cited by examiner

*Primary Examiner* — Vinh P Nguyen
(74) *Attorney, Agent, or Firm* — Muncy, Geissler, Olds & Lowe, P.C.

(57) ABSTRACT

The present application provides a testing system. The testing system includes a chip socket and a probe. The chip socket includes a pedestal and a fastener. The pedestal is configured to accommodate a chip to be tested. The fastener includes a top body and a base body. The top body includes a probing window surrounded by a plurality of side walls, wherein the probing window has a first end at an outer surface of the top body and a second end at an inner surface of the top body, a first angle between a first side wall of the plurality of side walls and the outer surface is less than 90 degrees, and a first opening area at the first end of the probing window is larger than a second opening area at the second end of the probing window.

12 Claims, 10 Drawing Sheets

SYSTEM AND METHOD FOR TESTING A SEMICONDUCTOR CHIP

TECHNICAL FIELD

The present disclosure relates to a system and a method for conducting a probing test.

DISCUSSION OF THE BACKGROUND

After years of improvement, dynamic random-access memories (DRAM) operate at higher and higher speeds. However, due to the improvements in speed, it has become increasingly difficult to test and analyze DRAMs using traditional equipment since the traditional equipment requires longer transmission paths which cause noise and distortion. Therefore, designing a testing system that can reduce lengths of transmission paths in order to test high-speed DRAMs has become an issue to be solved.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a chip socket. The chip socket includes a pedestal and a fastener. The pedestal is configured to accommodate a chip to be tested. The fastener comprises a top body and a base body. The top body comprises a probing window surrounded by a plurality of side walls, wherein the probing window has a first end at an outer surface of the top body and a second end at an inner surface of the top body, a first angle between a first side wall of the plurality of side walls and the outer surface is less than 90 degrees, and a first opening area at the first end of the probing window is larger than a second opening area at the second end of the probing window. The base body is attached to the pedestal and configured to be locked to the top body when the top body covers the base body and clamps the chip. When the top body covers the base body, the probing window is configured to reveal a surface of the chip so as to allow a probe to contact the surface of the chip through the probing window.

In some embodiments, the fastener further comprises a hinge member configured to connect the top body to the base body.

In some embodiments, the top body further comprises a first locking structure, and the base body comprises a second locking structure configured to be locked to the first locking structure when the top body covers the base body.

In some embodiments, the fastener further comprises a spring disposed close to the first locking structure or the second locking structure, and configured to provide a pushing force so as to further fasten the chip when the top body covers the base body and clamps the chip.

In some embodiments, the first opening area is a rectangle having two long sides and two short sides, and the first side wall is connected to one of the two short sides.

In some embodiments, a second side wall of the plurality of side walls is connected to one of the two long sides of the first opening area, and the second side wall is perpendicular to the outer surface.

In some embodiments, the first angle is between 30 degrees and 60 degrees.

In some embodiments, the pedestal comprises an interposer configured to accept a solder contact of the chip and to be coupled to a tester.

Another aspect of the present disclosure provides a testing system. The testing system comprises a chip socket and a probe. The chip socket includes a pedestal and a fastener. The pedestal is configured to accommodate a chip to be tested. The fastener comprises a top body and a base body. The top body comprises a probing window surrounded by a plurality of side walls, wherein the probing window has a first end at an outer surface of the top body and a second end at an inner surface of the top body, a first angle between a first side wall of the plurality of side walls and the outer surface is less than 90 degrees, and a first opening area at the first end of the probing window is larger than a second opening area at the second end of the probing window. The base body is attached to the pedestal and configured to be locked to the top body when the top body covers the base body and clamps the chip. The probe is configured to transmit and receive a testing signal. When the top body covers the base body, the probing window reveals a surface of the chip and the probe contacts the surface of the chip through the probing window.

In some embodiments, the fastener further comprises a hinge member configured to connect the top body to the base body.

In some embodiments, the top body further comprises a first locking structure, and the base body comprises a second locking structure configured to be locked to the first locking structure when the top body covers the base body.

In some embodiments, the fastener further comprises a spring disposed close to the first locking structure or the second locking structure, wherein the spring is configured to provide a pushing force so as to further fasten the chip when the top body covers the base body and clamps the chip.

In some embodiments, the first opening area is a rectangle having two long sides and two short sides, and the first side wall is connected to one of the two short sides.

In some embodiments, a second side wall of the plurality of side walls is connected to one of the two long sides of the first opening area, and the second side wall is perpendicular to the outer surface.

In some embodiments, the first angle is between 30 degrees and 60 degrees.

In some embodiments, the testing system further comprises a tester configured to generate, transmit and receive testing signals for testing the chip.

In some embodiments, the pedestal comprises an interposer configured to accept a solder contact of the chip and to be coupled to the tester.

Another aspect of the present disclosure provides a method for testing a chip. The method comprises placing the chip on a pedestal of a chip socket; clamping the chip with a fastener of the chip socket, wherein the fastener comprises a top body and a base body, the top body comprises a probing window, and a surface of the chip is revealed by the probing window when the top body covers the base body and clamps the chip; and probing the chip through the probing window of the top body. The probing window is surrounded by a plurality of side walls, the probing window has a first end at an outer surface of the top body and a second end at an inner surface of the top body, a first angle between a first side wall of the plurality of side walls and the outer surface is less than 90 degrees, and a first opening area at the first end of the probing window is larger than a second opening area at the second end of the probing window.

In some embodiments, the pedestal comprises an interposer configured to accept a solder contact of the chip, and the method further comprises generating testing signals and sending the testing signals to the chip through the interposer.

In some embodiments, the first angle is between 30 degrees and 60 degrees.

The chip socket, the testing system, and the method for testing a chip provided by the embodiments of the present embodiments allow use of a fastener having a probing window that allows the probe to contact a chip directly on its surface and receive a signal from the chip. Therefore, lengths of the transmission paths of signals transmitted during the testing process can be reduced, and the noise and distortion caused by long transmission paths can also be reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiments disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
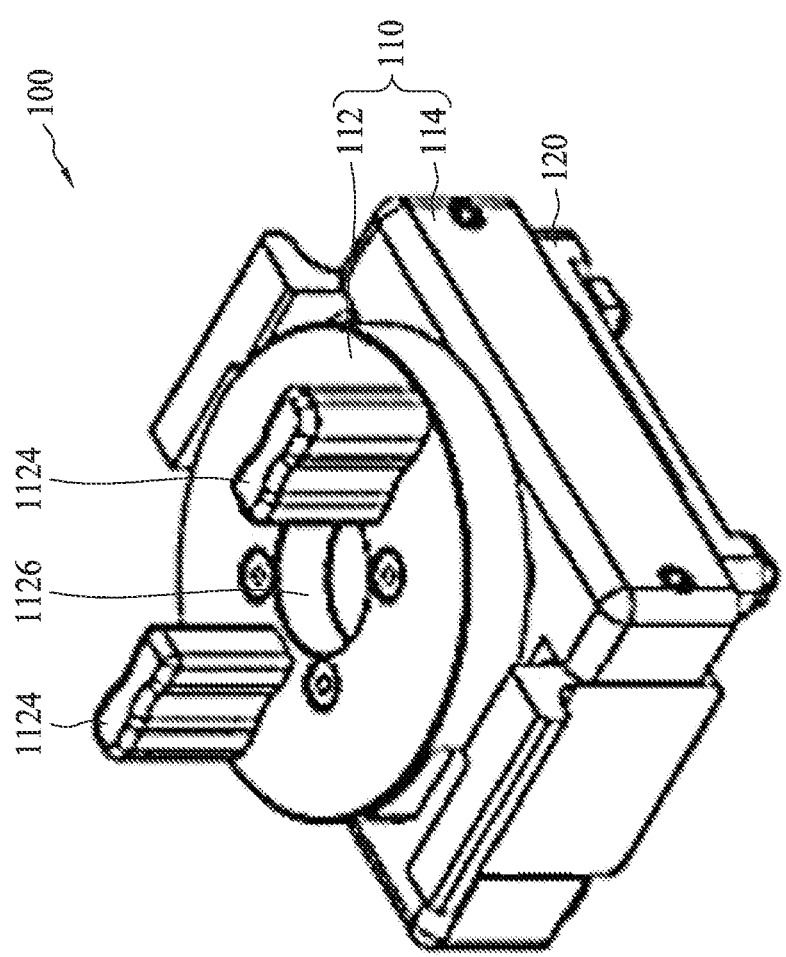
FIG. 1 shows a perspective view of a chip socket.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to," or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientations, layouts, locations, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device. Specifically, semiconductor devices of embodiments of the present disclosure may be dynamic random-access memory devices.

Figure 2:
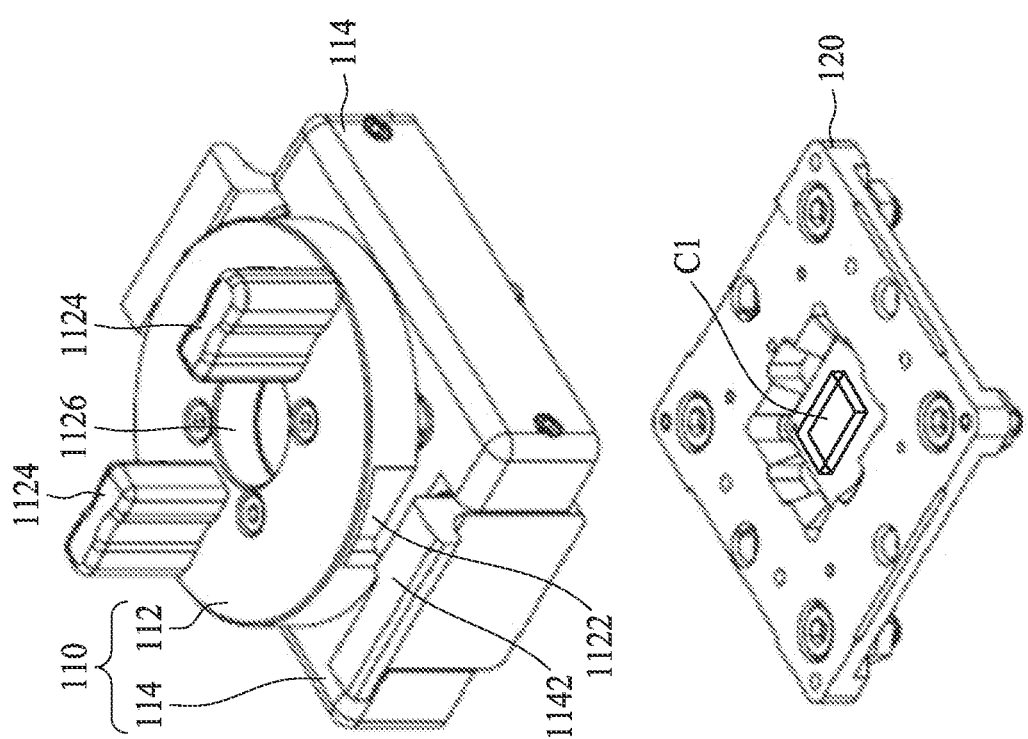
FIG. 2 shows a breakdown view of the chip socket in FIG. 1

FIG. 1 shows a perspective view of a chip socket 100, and FIG. 2 shows a breakdown view of the chip socket 100. The chip socket 100 includes a fastener 110 and a pedestal 120. As shown in FIG. 2, the pedestal 120 can accommodate a device under test (DUT), such as a DRAM chip C1. The fastener 110 includes a first member 112 and a second member 114. The second member 114 is attached to the pedestal 120 and has a latch structure 1142. The first member 112 includes a latch structure 1122 that can slide into a gap of the latch structure 1142. That is, by screwing the first member 112 onto the second member 114, the first member 112 can be locked to the second member 114. Therefore, when the first member 112 is locked to the second member 114, the chip C1 is fastened by the fastener 110 within the chip socket 100.

To allow the user to screw the first member 112 on to the second member 114 easily, the first member 112 of the fastener 110 may further include handles 1124 as shown in FIG. 1. Furthermore, the first member 112 can further include a window 1126 in the middle of the first member 112 so that the surface of the chip C1 can be revealed for temperature control when the fastener 110 fastens the chip C1 within the chip socket 100.

In some embodiments, the window 1126 may allow probe needles to pass through so that the testing platform can probe the chip C1 by contacting its surface. Therefore, lengths of transmission paths of signals can be reduced, and noise and distortion caused by long transmission paths can also be reduced. In contrast, in comparative embodiments, probe needles are fixed to the testing platform and can only probe a chip from certain angles. In such case, if an opening area of a window is not large enough and/or a depth of the window is too great, then the probe needle may not be able to contact a surface of the chip through the window. Furthermore, handles may also become obstacles for the probe needles, which makes a testing process more difficult.

Figure 3:
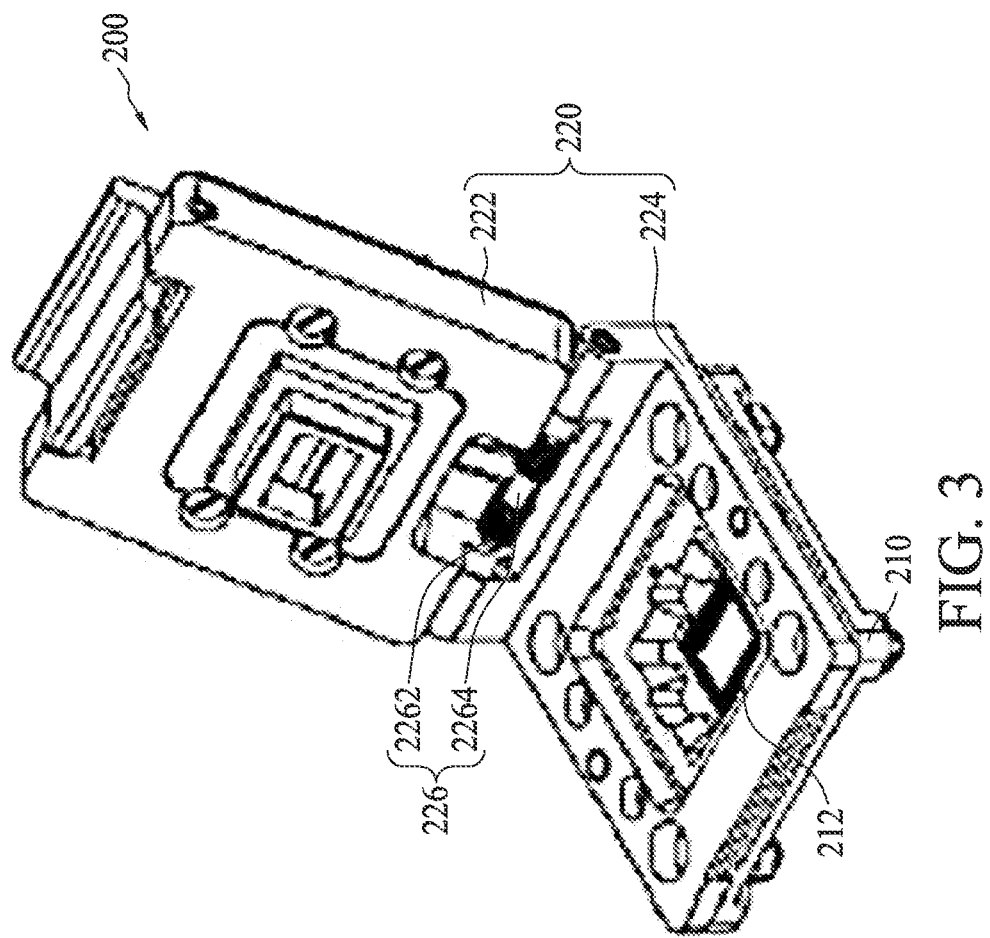
FIG. 3 shows a chip socket according to one embodiment of the present disclosure.

FIG. 3 shows a chip socket 200 according to one embodiment of the present disclosure. The chip socket 200 is designed to have a larger probing window so that a testing platform with probing needles (or probes) can be adopted for testing with better convenience.

Figure 4:
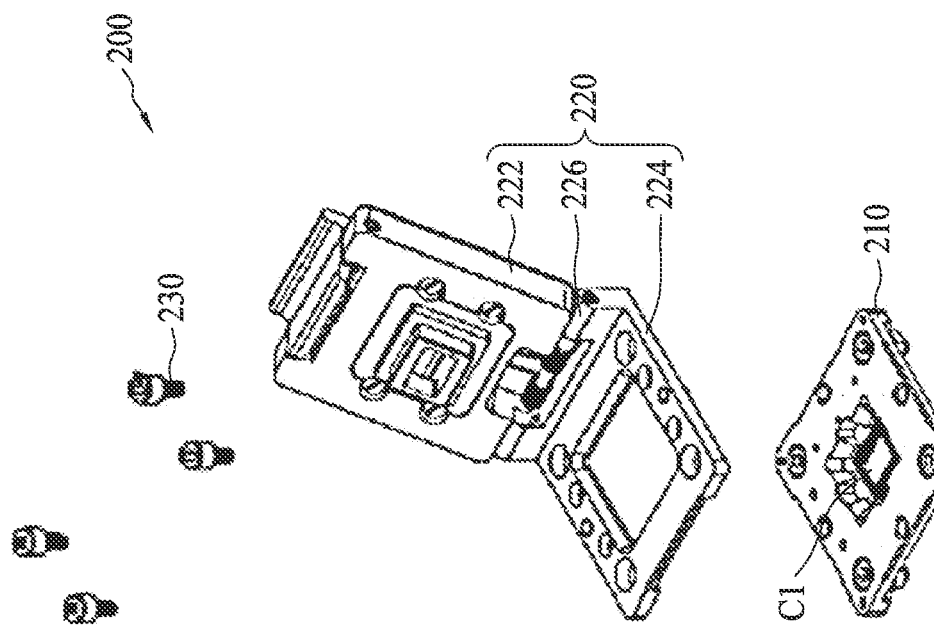
FIG. 4 shows a breakdown view of the chip socket in FIG. 3.

FIG. 4 shows a breakdown view of the chip socket 200 in FIG. 3. As shown in FIG. 4, the chip socket 200 includes a pedestal 210 and a fastener 220. The pedestal 210 can accommodate a chip to be tested, such as the DRAM chip C1. The fastener 220 includes a top body 222 and a base body 224, and the base body 224 can be attached to the pedestal 210 by, for example but not limited thereto, screws 230.

Figure 5:
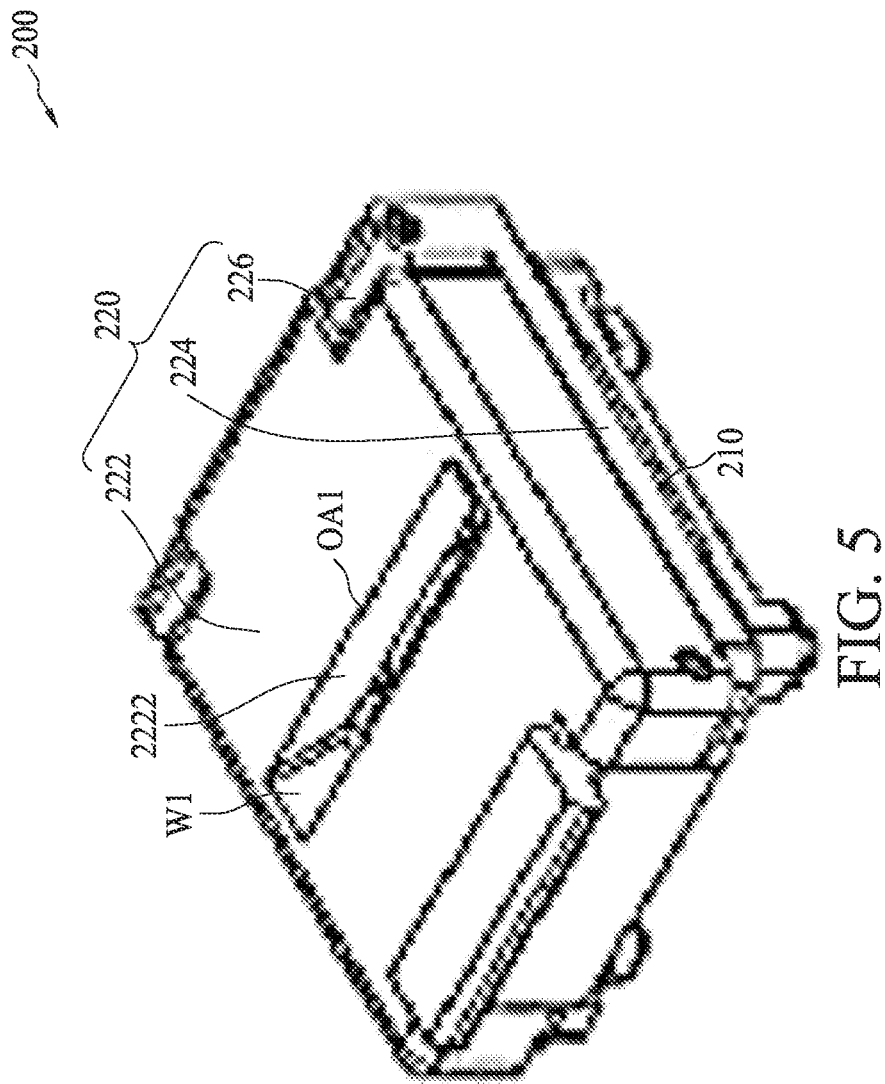
FIG. 5 shows the chip socket in FIG. 3 when the top body covers the base body.

As shown in FIG. 3, the top body 222 can be lifted so that a user can place the chip C1 on a central platform 212 of the pedestal 210. When the chip C1 is under test, the top body 222 can cover the base body 224 and the base body 224 can be locked to the top body 222 so that the chip C1 can be clamped within the chip socket 200. FIG. 5 shows the chip socket 200 when the top body 222 covers the base body 224.

Figure 6:
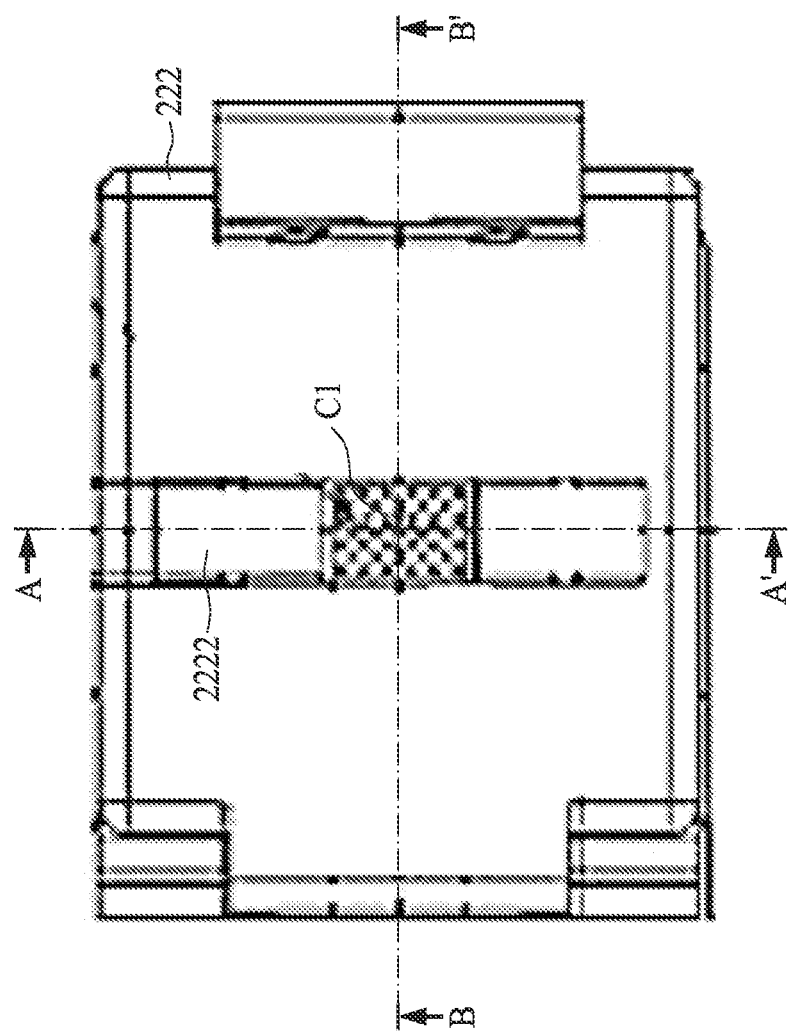
FIG. 6 shows a top view of the chip socket in FIG. 3 when the top body covers the base body.

As shown in FIG. 5, the top body 222 includes a probing window 2222 surrounded by a plurality of side walls. FIG. 6 further shows a top view of the chip socket 200 when the top body 222 covers the base body 224. As shown in FIG. 5 and FIG. 6, when the top body 222 covers the base body 224, the probing window 2222 can reveal a surface of the chip C1 so as to allow a probe 24 to contact the surface of the chip C1 through the probing window 2222.

Figure 7:
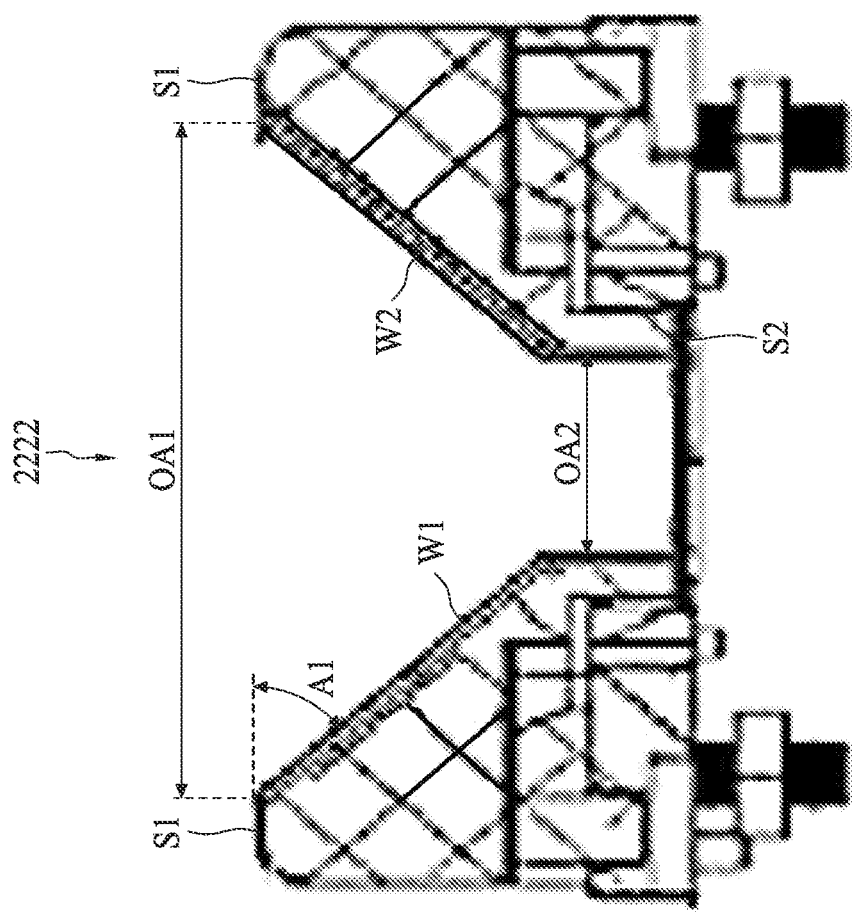
FIG. 7 shows a sectional view of the chip socket in FIG. 3 along a cutting line shown in FIG. 6.

FIG. 7 shows a sectional view of the chip socket 200 along a cutting line A-A' shown in FIG. 6. As shown in FIG. 7, the probing window 2222 has a first end at an outer surface S1 of the top body 222 and a second end at an inner surface S2 of the top body 222, and a first opening area OA1 at the first end of the probing window 2222 is larger than a second opening area OA2 at the second end of the probing window 2222. In the present embodiment, such configuration can be achieved by using inclined sidewalls surrounding the probing window 2222.

For example, as shown in FIG. 5, the first opening area OA1 is a rectangle having two long sides and two short sides, wherein a first side wall W1 connected to one of the short sides of the first opening area OA1 is inclined. That is, a first angle A1 between the side wall W1 and the outer surface S1 is less than 90 degrees.

In some embodiments, the first angle A1 can be between 30 degrees and 60 degrees. For example, the first angle A1 can be 45 degrees. The inclined sidewall W1 allows the probing needles to enter the probing window 2222 at certain angles and reach the surface of the chip to be tested. In some embodiments, the inclined angle A1 can be determined according to an allowable range of probing angles provided by the probing needle of the testing platform.

Furthermore, in some embodiments, the testing platform may include a pair of probes that can probe the device under test from opposite directions. Therefore, in the present embodiment, a second side wall W2 connected to another short side of the first opening area OA1 can also be inclined by 45 degrees as shown in the sectional view of FIG. 7.

In addition, to simplify the production of the chip socket 200, sidewalls connected to the long sides of the first opening area OA1 can be perpendicular to the outer surface S1 as shown in FIG. 5. However, the present disclosure is not limited thereto. In some other embodiments, all the side walls surrounding the first opening area OA1 can be inclined. Also, in some other embodiments, the first opening area OA1 of the probing window 2222 may be any shape, such as round, triangular or pentagonal.

As shown in FIG. 3, the fastener 220 can further include a hinge member 226 for connecting the top body 222 to the base body 224. The hinge member 226 may include knuckles 2262 disposed on the top body 222 and the second body 224, and a pin 2264 passing through the knuckles 2262, thereby allowing the top body 222 to rotate along the fixed axis of the pin 2264. Consequently, the top body 222 can be lifted to reveal the base body 224, and the top body 222 can be easily closed to cover the base body 224.

In addition, to further ensure that the chip C1 to be tested can be fixed at a desired position during probing and testing processes, the top body 222 and the base body 224 may further include locking structures so as to keep the chip C1 in a fixed position.

Figure 8:
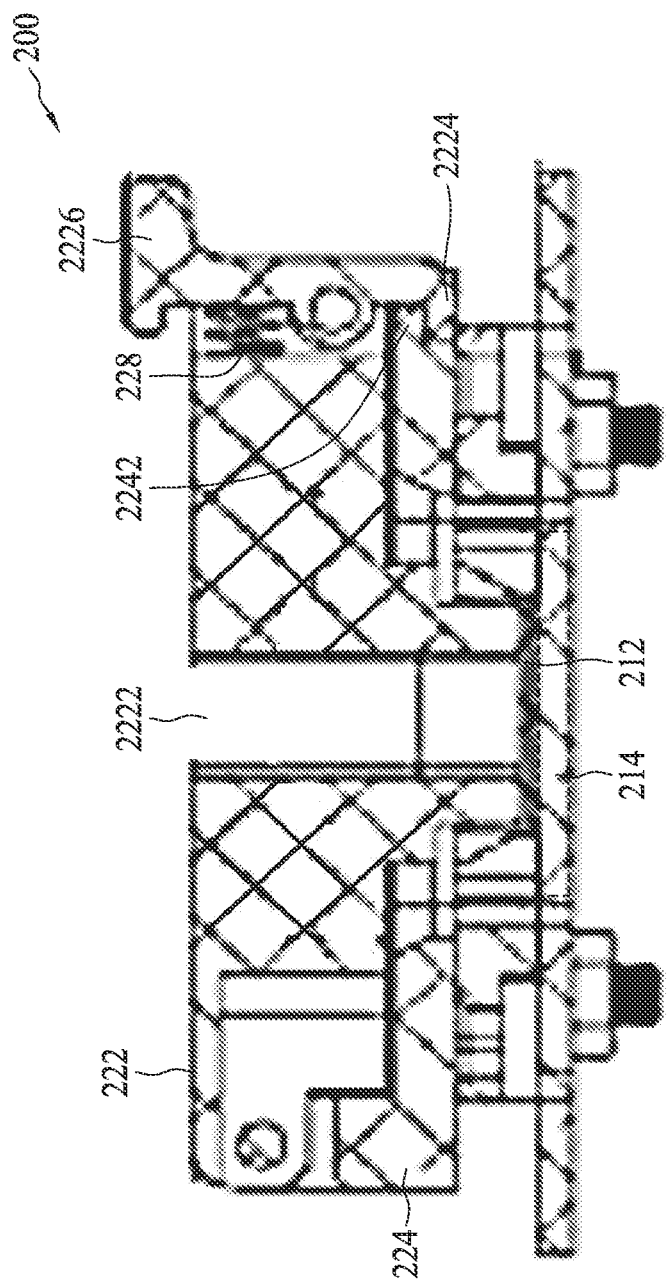
FIG. 8 shows another sectional view of the chip socket in FIG. 3 along another cutting line shown in FIG. 6.

FIG. 8 shows another sectional view of the chip socket 200 along a cutting line B-B' shown in FIG. 6. As shown in FIG. 8, the top body 222 may further include a first locking structure 2224, and the base body 224 may comprise a second locking structure 2242 to be locked to the first locking structure 2224 when the top body 222 covers the base body 224.

For example, the first locking structure 2224 may have a hook structure while the second locking structure 2242 may have a groove structure that allows a hook of the first locking structure 2224 to slide in when the top body 222 covers the base body 224. Consequently, the first locking structure 2224 and the second locking structure 2242 can be locked to each other. However, the present disclosure is not limited thereto. In other embodiments, other types of locking structures or latching structures may be adopted to form the first locking structure 2224 and the second locking structure 2242.

In addition, to allow the user to lift or close the top body 222 more easily, the top body 222 may further include a handle 2226 as shown in FIG. 8.

Furthermore, in the present embodiment, the fastener 220 may further include a spring 228. The spring 228 can be disposed near the first locking structure 2224 or the second locking structure 2242; therefore, when the top body 222 covers the base body 224, the spring 228 is able to provide a pushing force, thereby further fastening the chip C1 within the chip socket 200.

In some embodiments, the pedestal 210 can further include an interposer 214 and a printed circuit board 216 disposed on the central platform 212 for accepting the chip C1 to be tested. The interposer 214 may include conductive bodies, such as metal bumps, that correspond to solder contacts, such as a ball grid array (BGA), of the chip. Therefore, when the chip C1 is placed on the interposer 214, the conductive bodies of the interposer 214 are correspondingly coupled to the solder contacts of the chip C1. Consequently, the tester can be coupled to the chip C1 for sending and receiving signals through the printed circuit board 216 and the interposer 214.

Figure 9:
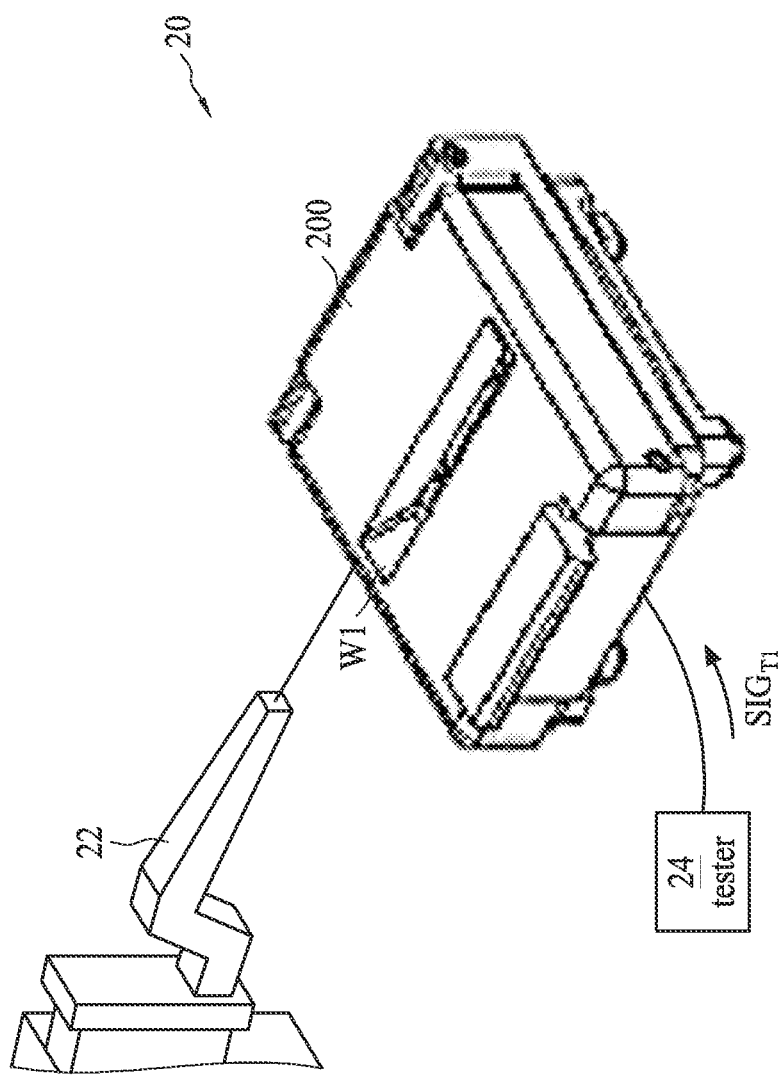
FIG. 9 shows a testing system according to one embodiment of the present disclosure.

FIG. 9 shows a testing system 20 according to one embodiment of the present disclosure. The testing system 20 includes the chip socket 200, a probe 22 and a tester 24. In such embodiment, the tester 24 can generate testing signals $SIG_{T1}$ and send the testing signals $SIG_{T1}$ to the chip C1 and/or receive testing signals $SIG_{T1}$ from the chip C1 through the interposer 214 and the printed circuit board 216. In some embodiments, the tester 24 may be coupled to the chip socket 200 through transmission lines or another circuit board.

Because the fastener 220 includes the probing window 2222 on the top body 222, the probe 22 can pass through the probing window 2222 and contact the surface of the chip C1 and directly detect signals from the surface of the chip C1. Therefore, a length of the transmission path of the signals can be reduced, and the noise and distortion caused by long transmission paths can also be reduced.

Furthermore, because the sidewalls W1 and W2 that surround the probing window 2222 are inclined, the first opening area OA1 at the first end of the probing window 2222 is larger than the second opening area OA2 at the second end of the probing window 2222. Therefore, even if the probe 22 is partially fixed and can only reach the device under test at certain angles, a wide opening at the first end of the probing window 2222 can still allow the probe 22 to pass through and reach the surface of the chip C1 that is placed at a bottom of the chip socket 200.

Figure 10:
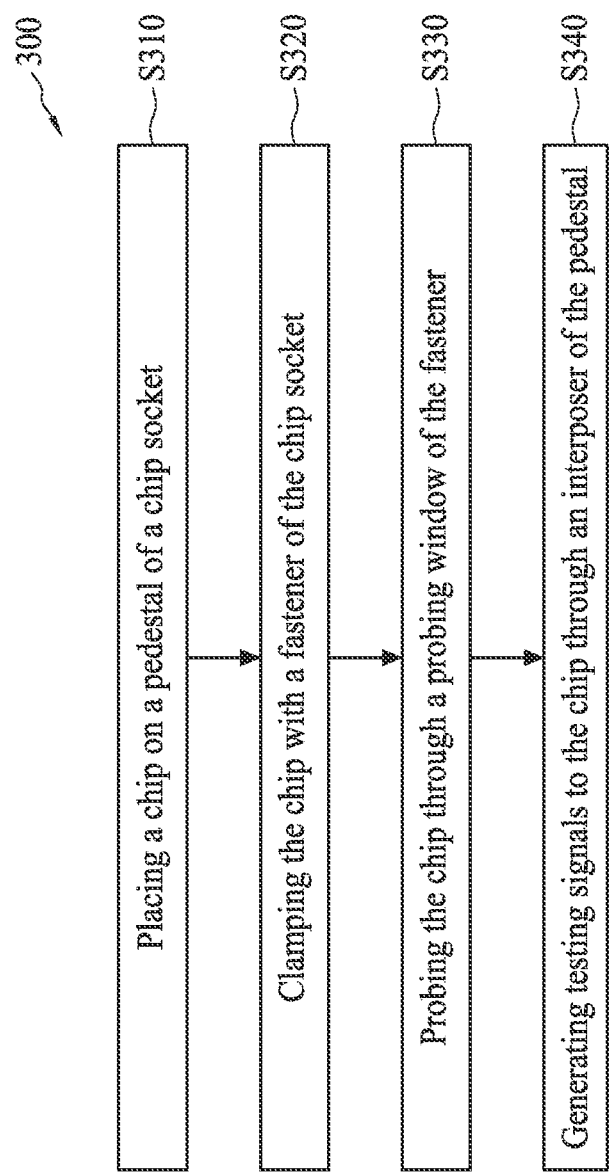
FIG. 10 shows a flowchart of a method for testing a chip.

FIG. 10 shows a flowchart of a method 300 for testing the chip C1. In some embodiments, the method 300 can be performed with the chip socket 200 or the testing system 20 and can include steps S310 to S340 as described below.

In step S310, a chip C1 is placed on a pedestal 210 of a chip socket 200.

In step S320, the chip C1 is clamped with a fastener 220 of the chip socket 200.

In step S330, the chip C1 is probed through a probing window 2222.

In step S340, testing signals $SIG_{T1}$ are generated and sent to the chip C1 through an interposer 212 of the pedestal 210.

In step S310, the chip C1 can be placed on the interposer 212 of the pedestal 210. In such step, the tester 24 can be used to generate testing signals $SIG_{T1}$ required by the testing specifications and send the testing signals $SIG_{T1}$ to the chip C1 through the interposer 212 and the printed circuit board 214.

In step S320, the chip C1 to be tested can be clamped by the fastener 220. For example, the top body 222 of the fastener 220 can cover the base body 224 of the fastener 220, and the first locking structure 2224 of the top body 222 can be locked to the second locking structure 2242 of the base body 224 as shown in FIG. 5. Therefore, the chip C1 can be fixed in the desired position, thereby stabilizing the electrical connection between the chip C1 and the interposer 212.

Consequently, the probe 22 can be inserted into the probing window 2222 and contact the surface of the chip C1 for probing the chip C1 in step S330. As shown in FIG. 5, since the sidewalls W1 and W2 that surround the probing window 2222 are inclined, the first opening area OA1 at the first end of the probing window 2222 is larger than the second opening area OA2 at the second end of the probing window 2222. Therefore, even if the probe 22 is partially fixed and can only reach the chip C1 at certain angles, the wide opening at the first end of the probing window 2222 can still allow the probe 22 to pass through and reach the surface of the chip C1 that is placed at the bottom of the chip socket 200.

Furthermore, in step S340, the tester 24 can generate testing signals $SIG_{T1}$ and send the testing signals $SIG_{T1}$ through the interposer 212 of the pedestal 210. According to the method 300, the chip C1 can receive testing signals $SIG_{T1}$ through its bottom surface, which is coupled to the interposer 212, and signals from the chip C1 can be detected by the probe 22 through a top surface of the chip C1. That is, the chip socket 200 and the testing system 20 allow users to test chips with more flexibility and less transmission noise.

In summary, the chip sockets, the testing systems, and the methods for testing chips provided by the embodiments of the present disclosure adopt a fastener having a probing window that allows the probe to contact a chip directly on its surface and receive signals from the chip. Therefore, lengths of the transmission paths of signals during the testing process can be reduced, and the noise and distortion caused by long transmission paths can also be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A testing system comprising:
   a chip socket comprising:
      a pedestal configured to accommodate a chip to be tested; and
      a fastener comprising:
         a top body comprising a probing window surrounded by a plurality of side walls, wherein the probing window has a first end at an outer surface of the top body and a second end at an inner surface of the top body, a first angle between a first side wall of the plurality of side walls and the outer surface is less than 90 degrees, and a first opening area at the first end of the probing window is larger than a second opening area at the second end of the probing window; and a base body attached to on the pedestal and configured to be locked to the top body when the top body covers the base body and clamps the chip; and a probe configured to probe the chip to be tested;

wherein when the top body covers the base body, the probing window reveals a surface of the chip and the probe contacts the surface of the chip through the probing window.

2. The testing system of claim 1, wherein the fastener further comprises a hinge member configured to connect the top body to the base body.

3. The testing system of claim 1, wherein the top body further comprises a first locking structure, and the base body comprises a second locking structure configured to be locked to the first locking structure when the top body covers the base body.

4. The testing system of claim 3, wherein the fastener further comprises a spring disposed close to the first locking structure or the second locking structure, and configured to provide a pushing force so as to further fasten the chip when the top body covers the base body and clamps the chip.

5. The testing system of claim 1, wherein the first opening area is a rectangle having two long sides and two short sides, and the first side wall is connected to one of the two short sides.

6. The testing system of claim 5, wherein a second side wall of the plurality of side walls is connected to one of the two long sides of the first opening area, and the second side wall is perpendicular to the outer surface.

7. The testing system of claim 1, wherein the first angle is between 30 degrees and 60 degrees.

8. The testing system of claim 1, further comprising a tester configured to generate, send and receive testing signals for testing the chip.

9. The testing system of claim 8, wherein the pedestal comprises an interposer configured to accept solder contact of the chip and to be coupled to the tester.

10. A method for testing a chip comprising:

placing the chip on a pedestal of a chip socket;

clamping the chip with a fastener of the chip socket, wherein the fastener comprises a top body and a base body, the top body comprises a probing window, and a surface of the chip is revealed by the probing window when the top body covers the base body and clamps the chip; and probing the chip through the probing window of the top body;

wherein the probing window is surrounded by a plurality of side walls, the probing window has a first end at an outer surface of the top body and a second end at an inner surface of the top body, a first angle between a first side wall of the plurality of side walls and the outer surface is less than 90 degrees, and a first opening area at the first end of the probing window is larger than a second opening area at the second end of the probing window.

11. The method of claim 10, wherein the pedestal comprises an interposer configured to accept a solder contact of the chip, and the method further comprises generating testing signals and sending the testing signals to the chip through the interposer.

12. The method of claim 10, wherein the first angle is between 30 degrees and 60 degrees.

* * * * *